United States Patent [19]
Yahatz et al.

[11] Patent Number: 5,817,188
[45] Date of Patent: Oct. 6, 1998

[54] FABRICATION OF THERMOELECTRIC MODULES AND SOLDER FOR SUCH FABRICATION

[75] Inventors: Michael Yahatz; James Harper, both of Lawrenceville, N.J.

[73] Assignee: Melcor Corporation, Trenton, N.J.

[21] Appl. No.: 713,106

[22] Filed: Sep. 16, 1996

Related U.S. Application Data

[63] Continuation-in-part of Ser. No. 538,449, Oct. 3, 1995, abandoned.

[51] Int. Cl.[6] .............................. H01L 35/08; H01L 35/34
[52] U.S. Cl. ......................... 136/237; 136/201; 136/203; 136/205; 136/224
[58] Field of Search .................. 136/237, 236.1, 136/238, 240, 201, 224, 203, 205, 211, 212

[56] References Cited

U.S. PATENT DOCUMENTS

| | | | |
|---|---|---|---|
| 2,685,608 | 8/1954 | Justi | 136/4 |
| 3,079,455 | 2/1963 | Haba | 136/5 |
| 3,110,100 | 11/1963 | Hill | 29/473.1 |
| 3,449,173 | 6/1969 | Rupprecht et al. | 136/205 |
| 3,485,978 | 12/1969 | Grindell | 200/144 |
| 3,859,143 | 1/1975 | Krebs | 136/205 |
| 4,489,742 | 12/1984 | Moore et al. | 136/203 |
| 4,503,131 | 3/1985 | Baudrand | 428/672 |
| 4,764,212 | 8/1988 | Okumura | 75/228 |
| 4,806,309 | 2/1989 | Tulman | 420/562 |
| 4,855,810 | 8/1989 | Gelb et al. | 357/87 |
| 5,429,680 | 7/1995 | Fuschetti | 136/203 |

OTHER PUBLICATIONS

Zhenmao, L. et al., *The Adhesive Strength Research of Thermoelectric Couple Metallized Layers*, Abstract, pp. 569–571. No month or year available.

Kolenko, Ye A., "Thermoelectric Cooling Devices", *Termoelektricheskive Ckhlazhdayushchive Pribory*, Jun. 1967, pp. 131–138.

Weast, Robert C., ed., *CRC Handbook of Chemistry and Physics*, 1968, pp. B–100, B–102 & B–103.

*Primary Examiner*—Kathryn L. Gorgos
*Assistant Examiner*—Chrisman D. Carroll
*Attorney, Agent, or Firm*—Darby & Darby

[57] ABSTRACT

A thermoelectric module is formed with a solder joint, the solder containing about 50 to 99 weight percent bismuth and about 50 to 1 weight percent antimony, between the thermoelectric elements and the connecting conductors. Also provided is a thermoelectric module having bismuth telluride elements coated with a conductive material that does not require a nickel or other diffusion barrier. Further provided are modules having conductors with a phosphorus-nickel surface. Methods of manufacturing and using such thermoelectric modules are further provided.

22 Claims, 2 Drawing Sheets

FABRICATION OF THERMOELECTRIC MODULES AND SOLDER FOR SUCH FABRICATION

This is a Continuation-in-Part of application Ser. No. 08/538,449, filed Oct. 3, 1995, for "Fabrication of Thermoelectric Modules and Solder for Such Fabrication", now abandoned.

FIELD OF THE INVENTION

This invention relates to improved thermoelectric devices and to improved methods of fabricating such devices. More particularly, the invention relates to an improved joining solder, based on an alloy of bismuth and antimony, for use with thermoelectric modules; to thermoelectric elements soldered to a phosphorus-nickel surface on a conductor, such as copper, to form thermoelectric modules; and to the use of such thermoelectric modules.

BACKGROUND OF THE INVENTION

Thermoelectric modules are small solid-state devices that can operate as heat pumps or as electrical power generators. When used to generate electricity, the modules are called thermoelectric generators (TEG). TEG use the Seebeck effect to generate a voltage when a temperature differential is applied.

When the modules are used as heat pumps, the modules are called thermoelectric coolers (TEC) or thermoelectric heaters (TEH) and demonstrate the Peltier effect. With the Peltier effect a temperature change results when current passes through a junction of two different types of semiconductors. Generally such semiconductors are assembled into thermoelectric modules where heat is transferred from one side of the module to the other side when current is applied. These modules can act as cooling devices where the heat pumped from the cooling side dissipates into a heatsink on the other side. The sides of the modules are generally composed of a ceramic material.

Located between the ceramic sides are semiconductor elements made from bismuth telluride, which is composed of bismuth, tellurium, selenium, and antimony. The semiconductor elements are doped to create either an excess (n-type) or a deficiency (p-type) of electrons. Typical modules of this type are described in U.S. Pat. No. 4,855,810, Gelb et al. According to the prior art, these modules contain semiconductor elements soldered to conductors using a solder including bismuth and tin. One such solder is described in U.S. Pat. No. 3,079,455, Haba. Haba describes a solder formed of tin, antimony, and bismuth. The bismuth is described as being in an amount from 40 to 50 weight percent and the antimony is described as being in an amount of 1.5 to 3.5 weight percent Thermoelectric modules built with bismuth telluride elements are used in applications where they are exposed to temperatures ranging from about −80° C. to about 250° C. The performance of such thermoelectric modules made with a tin-containing solder suffers as a result of long term exposure to wide temperature ranges. In fact, the performance of the modules has been found to decrease about fifteen percent or more per year. Thermoelectric modules made with tin-containing solder are not truly considered serviceable at temperatures substantially above 80° C.

One reason for the lack of serviceability is that the standard bismuth tin solder melts at 138° C. At temperatures above 80° C., the tin in the solder tends to diffuse rapidly into the semiconductor elements and into the crystal lattice of the semiconductor elements, where it acts as a dopant or reacts with material of the elements. Also, the tin forms a film over the surface of the material adjacent to the soldered ends, the tin acting as a resistor connected across the elements causing an IR drop and/or a short.

Gelb et al. sought to overcome the problems of tin diffusion and resistor formation by replacing the tin-based solder with a lead-antimony solder. However, at elevated temperatures, lead also diffuses and reacts with the thermoelectric semiconductor material to form a region of poor thermoelectric performance.

To prevent diffusion of lead or tin, the industry standard has been to employ a diffusion barrier between the elements and the solder, such as nickel layered on the elements. Such a system is shown, for example, in U.S. Pat. No. 5,429,680, Fuschetti. However, this technology is very complicated, costly, and does not completely prevent diffusion of the lead or tin. Furthermore, elements made from material covered with nickel are structurally weak and do not hold up in applications involving long term power or temperature cycling.

A solder formed from bismuth and antimony has been described to "tin" semiconductors. For example, Kolenko, Ye A., "Thermoelectric Cooling Devices," Foreign Science and Technology Center, U.S. Army Material Command, Department of the Army (AD 691 974), pp 131–138 (1967) describes, at Table 15, a solder having 90% bismuth and 10% antimony for the tinning of semiconductors and a BiSn joining solder. Also described at Table 15 is a solder having 80% bismuth and 20% antimony for the tinning of semiconductors. However, there is no suggestion of using this as a joining solder or in conjunction with a phosphorous-nickel surface for joining to conductors.

It is an object of the invention to provide a solder which does not react with the thermoelectric material to provide a source of diffusants, dopants, and reagents.

Another object of the invention is to provide a thermoelectric module having an improved life-time and low failure rate at elevated temperatures, including temperatures up to 275° C.

A further object of the invention is to provide a thermoelectric module having a soldered structure where the solder does not form resistors across the thermoelectric elements.

Yet a further object is to provide a thermoelectric module which eliminates the need for a costly diffusion barrier.

SUMMARY OF THE INVENTION

The invention comprises a solder for joining conductors (e.g. buss-bars), such as those made from copper, aluminum and other well-known conductive materials, to a conductive material deposited on an end of a thermoelectric element in a thermoelectric module, wherein said solder comprises about 50–99 weight percent bismuth and about 1–50 weight percent antimony, where the combined weight percent of the bismuth and antimony is about 100 percent, particularly when the conductors are provided with a surface of phosphorous-nickel.

The present invention also provides a method for manufacturing thermoelectric modules comprising:

1) depositing on each end of a bismuth telluride thermoelectric element a conductive material that does not require a diffusion barrier;

2) forming a surface of phosphorous-nickel on a conductor, such as copper or aluminum; and 3) joining said conductive material to said phosphorous-nickel surface with a solder comprising about 50 to 99 weight percent bismuth and about 1 to 50 weight percent antimony wherein the combined weight percent of the bismuth and antimony is about 100.

The conductive material of step 1 is a material comprising about 50 to 100 weight percent bismuth, the remainder being, essentially, antimony.

To generate electricity from a thermal gradient, the device is subjected to a temperature gradient across the thermoelectric elements and the conductive elements are connected to complete the electrical circuit. To generate a thermal gradient, as required for thermoelectric cooling or heating, the device is subjected to a flow of electric current A temperature gradient is created along the direction of the current flow through the thermoelectric elements due to the Peltier effect and this functions to cool at the cold junction and heat at the hot junction.

The invention provides for a thermoelectric module that can be used in applications having wide operating temperatures up to and including about 275° C.

DETAILED DESCRIPTION OF THE INVENTION

According to the present invention, a thermoelectric module is provided comprising an array of n-type and p-type thermoelectric elements formed of a semiconductive material, particularly a bismuth telluride material. The elements have a first end and a second end and are arranged in rows and columns of alternately placed n-type and p-type elements, as known in the prior art.

The elements have a thin coating of a conductive material deposited on each end wherein said coating is substantially free of a diffusion barrier such as nickel. Suitable materials for the coating are a bismuth-antimony alloy or pure bismuth. Thus, the conductive material comprises from about 50 to 100 weight percent bismuth, the remainder being, essentially, antimony. This coating, which provides a solderable surface, has a thickness of up to 0.001 inch.

A conductor, formed on a non-conductive substrate, is used to connect the elements. This conductor is provided with a surface of phosphorus-nickel containing at least 3.5% phosphorus. One method of forming the surface is to provide a layer of phosphorus-nickel on top of the conductor. The amount of phosphorous contained in the phosphorus-nickel surface is generally in the range of about 3.5 to 18%. Preferably, the amount of phosphorous is from 7 to 13%, and, most preferably, from 8 to 12%. The thickness of the phosphorus-nickel layer is generally from about 20 to about 400 micro-inches. Preferably, the conductor is copper.

The phosphorous-nickel surface is soldered to the thin coating of conductive material on the thermoelectric elements using a solder comprising about 50 to 99 weight percent bismuth and about 50 to 1 weight percent antimony. Particularly for high temperature use, the solder is free of elements that act as dopants, such as tin, copper, silver, gold, lead, zinc, cadmium, indium, gallium, iodine, chlorine, sodium, and potassium. In a preferred embodiment of the present invention, the solder comprises about 75 to 96 weight percent bismuth and about 25 to 4 weight percent antimony. In a most preferred embodiment of the present invention the solder comprises about 80 to 95 weight percent bismuth and about 20 to 5 weight percent antimony.

Figure 1:
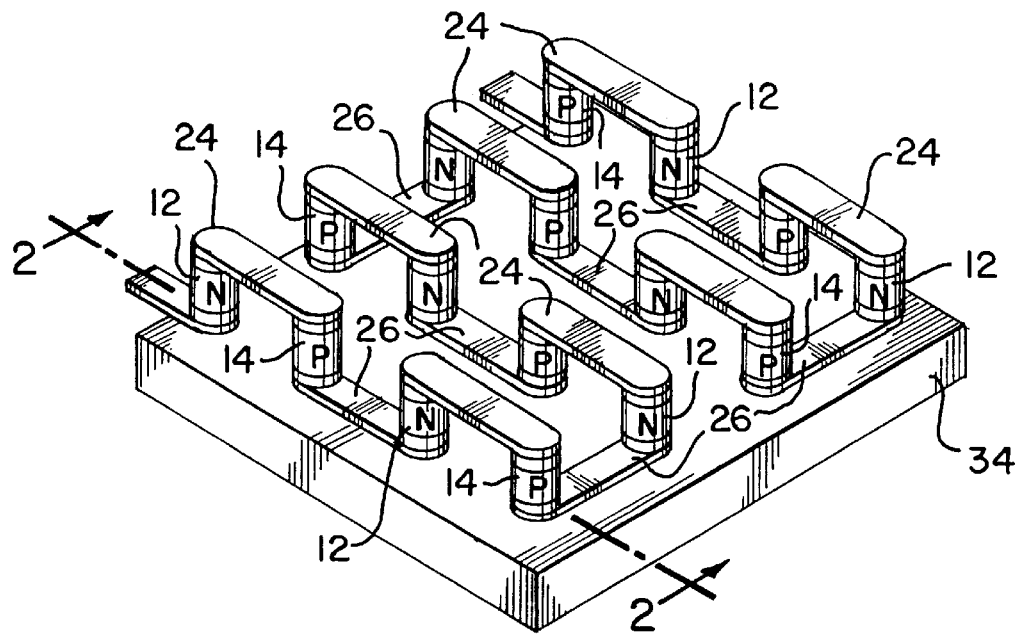
FIG. 1 is an isometric view of a thermoelectric module with one of the two ceramic sides removed to more clearly show the module elements.
Figure 2:
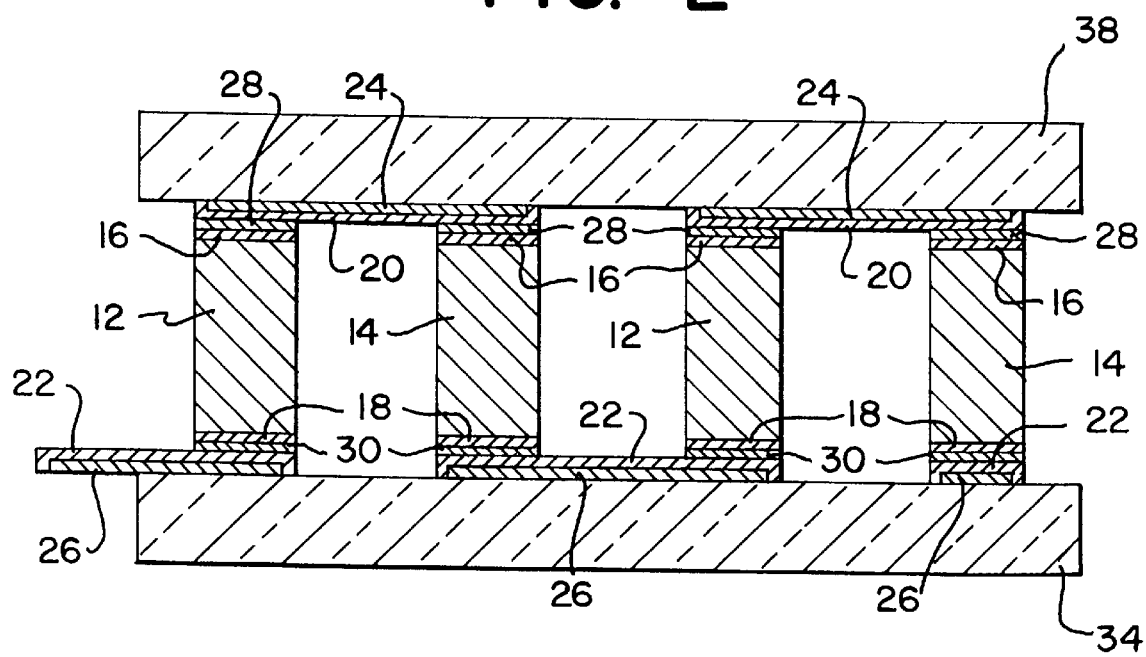
FIG. 2 is a cross-sectional view of a thermoelectric module taken along line 2—2 of FIG. 1.
Figure 3:
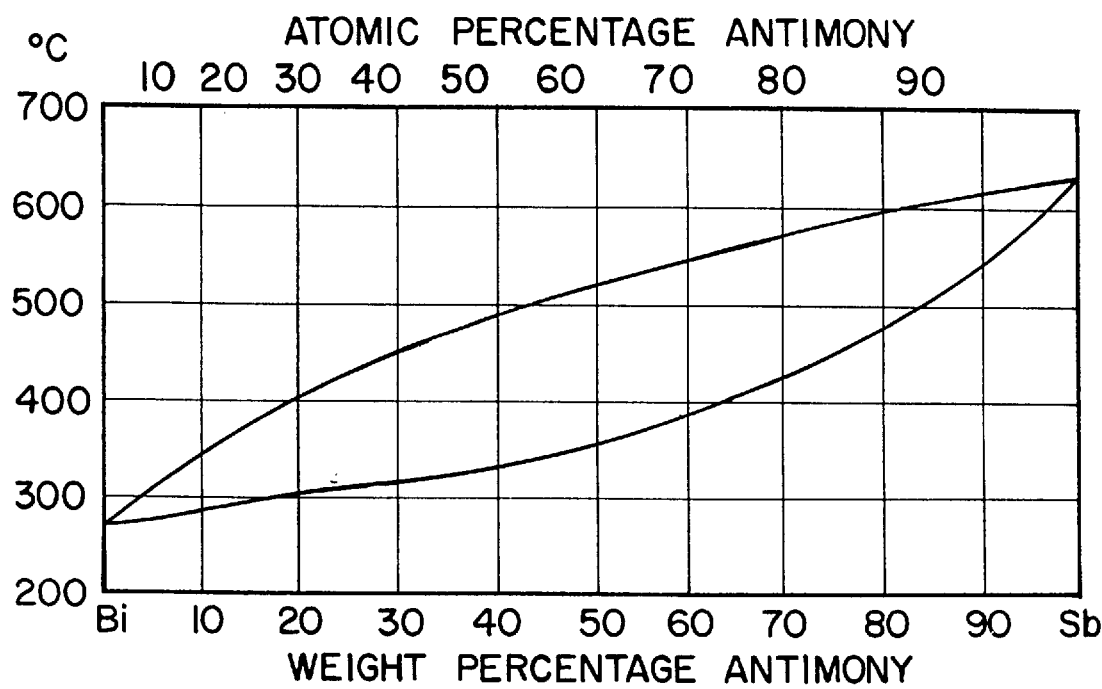
FIG. 3 is a phase diagram of a binary solder alloy system of bismuth and antimony suitable for use in the present invention.

Referring to the drawings, an improved thermoelectric module (10) (FIGS. 1 and 2) is shown having an array of bismuth telluride thermoelectric elements (12, 14) of n-type ($Bi_2Te_3$—$Bi_2Se_3$) and p-type ($Bi_2Te_3$—$Sb_2Te_3$). The n-type and p-type elements are shown having deposited on their ends thin coatings (16, 18) of pure bismuth or a bismuth-antimony alloy. The coatings are shown soldered to layers of phosphorus-nickel (20, 22) formed on conductors (24, 26). Connecting joints (28, 30) are formed from a solder of bismuth-antimony. The conductors are formed on non-conductive or insulating ceramic substrates (32, 34), such as aluminum oxide or beryllium oxide.

The invention is an improvement over standard modules as it provides a module that is capable of withstanding high temperatures, such as up to 275° C. This improvement allows the module to be used, for example, at 200° C. in autoclaves and other types of sterilization equipment. At temperatures above 200° C. the modules can be used in downhole oil well equipment and in automobile engines.

By orienting the device properly relative to the actual or desired thermal gradient and by providing electrical connections placing the device in series with a load or power source, energy conversion may be effected. When oriented so that the thermoelectric elements are all parallel to each other and to the direction of a thermal gradient, electricity will be supplied to a load or source in the circuit so long as the temperature gradient is maintained.

In a similar manner, if a current is applied to the device, it will generate a thermal gradient via the Peltier effect. Proper orientation of the device and current direction will result in either heating or cooling as desired.

The following Example illustrates manufacture of a preferred embodiment in accordance with the present invention:

EXAMPLE

Thermoelectric modules were fabricated using aluminum oxide plates having copper metallizations with a phosphorous-nickel layer containing approximately 10% (8% to 12%) phosphorous. The copper metallizations were connected to n-type and p-type elements as described below.

Semiconductor elements made from $Bi_2Te_3$—$Bi_2Se_3$ (n-type) and $Bi_2Te_3$—$Sb_2Te_3$ (p-type) were provided. The ends of the semiconductor elements were coated with a thin layer, approximately 0.001 inch in thickness, of a 95% bismuth: 5% antimony alloy. The coated layer on the semiconductor element was connected to the phosphorous nickel layer using a bismuth-antimony joining solder. A standard acid base flux and standard soldering techniques well known in the art were used.

Joining solder was used having the following Bismuth: Antimony weight percent content:

98.5:1.5
97.5:2.5
94.25:4.75
95:5
90:10
80:20.

Further, in place of the bismuth-antimony coating on the semiconductor elements, a pure bismuth coating was formed on the semiconductor elements before applying the joining solder.

The modules using the 95:5 joining solder were tested at 165° C. to 200° C. for 7000 hours with acceptable performance and no drastic changes in thermoelectric properties. The modules passed through 75,000 cycles in instant power reversal testing and 1000 temperature cycles without any failures. Improved results, compared to the prior art, are obtained with other bismuth, antimony ratios within the disclosed range for the joining solder along with the bismuth or bismuth-antimony coating on the semiconductor elements.

Results superior to prior art products are obtained with a phosphorus content between 7 and 13% and improved results, compared with the prior art, are obtained with a phosphorous content between about 3.5 and 18%.

In comparison, standard modules containing the nickel barrier and tin-containing solder did not pass even a limited number of power cycles.

The foregoing description is merely illustrative of the preferred embodiments and examples of the present invention and the scope of the invention is not to be limited thereto. Additional modifications of the invention will readily occur to one skilled in the art without departing from the scope of the invention.

What is claimed is:

1. A thermoelectric module comprising:
   a. an array of n-type and p-type thermoelectric elements formed of semi-conductive material;
   b. a thin coat of a conductive material deposited on each end of the elements, said material comprising about 50 to 100 weight percent bismuth, the remainder being, essentially antimony;
   c. a buss bar having a phosphorous-nickel surface wherein the phosphorous content of the surface is at least 3.5 weight percent;
   d. a solder comprising 50 to 99 weight percent bismuth and 50 to 1 weight percent antimony joining said coated thermoelectric elements to said phosphorous-nickel on said buss bar.

2. The module of claim 1, wherein the solder comprises about 75 to 96 weight percent bismuth and about 25 to 4 weight percent antimony.

3. The module of claim 2, wherein the solder comprises about 80 to 95 weight percent bismuth and about 20 to 5 weight percent antimony.

4. The module of claim 1, wherein the phosphorous content is about 3.5 to 18 weight percent.

5. The module of claim 4, wherein the phosphorous content is about 7 to 13 weight percent.

6. The module of claim 5, wherein the phosphorus content is about 8 to 12 weight percent.

7. The module of claim 1, wherein the buss bar is formed of copper.

8. The module of claim 1, wherein the phosphorous nickel surface on the buss bar is a layer of phosphorus-nickel formed on the buss bar.

9. A method for generating electricity comprising subjecting the thermoelectric module of claim 1 to a temperature gradient and connecting the respective buss bars to complete an electrical circuit.

10. A method for generating electricity from a thermal gradient, comprising:
   (a) orienting the module of claim 1 so that the direction of the thermal gradient is parallel to the desired direction of current flow through the thermoelectric elements;
   (b) maintaining said thermal gradient;
   (c) completing an electric circuit wherein an electrical current is generated.

11. A method of generating a thermal gradient comprising subjecting the thermoelectric device of claim 1 to the flow of an electric current, thereby creating a temperature gradient due to the Peltier effect along the direction of current flow in the thermoelectric element.

12. A method of effecting refrigeration comprising thermally connecting a cold junction of the thermoelectric module of claim 1 to an object to be refrigerated, thermally connecting a hot junction to a heat sink, and applying a direct current through the semiconductor elements of the module in a direction parallel to a temperature gradient in a direction so as to maintain the desired thermal gradient.

13. A method of effecting thermoelectric heating comprising connecting the hot junction of the thermoelectric device of claim 1 to an object to be heated, connecting the cold junction to a heat sink and applying a direct current through the semiconductor elements of the device in a direction parallel to a temperature gradient in a direction so as to maintain the desired thermal gradient.

14. A method of manufacturing thermoelectric modules capable of withstanding high temperature use comprising:
   a. depositing on each end of a thermoelectric element a conductive material, said material comprising about 50 to 100 weight percent bismuth, the remainder being, essentially, antimony;
   b. forming a surface of phosphorous-nickel onto a buss bar;
   c. joining said conductive material to said phosphorous-nickel surface with a solder comprised of about 50 to 99 weight percent bismuth and about 50 to 1 weight percent antimony wherein the combined weight percent of the bismuth and antimony is about 100 percent.

15. The method of claim 14 wherein the solder comprises about 75 to 96 weight percent bismuth and about 25 to 4 weight percent antimony.

16. The method of claim 15 wherein the solder comprises about 80 to 95 weight percent bismuth and about 20 to 5 weight percent antimony.

17. The method of claim 14 wherein the phosphorous-nickel layer comprises at least 3.5 weight percent phosphorous.

18. The method of claim 17 wherein the phosphorous content is about 3.5 to 18 weight percent.

19. The method of claim 18 wherein the phosphorous content is about 7 to 13 weight percent.

20. The method of claim 19 wherein the phosphorous content is about 8 to 12 weight percent.

21. The method of claim 14 wherein the buss bar is formed of copper.

22. The method of claim 14 wherein the phosphorous nickel surface is a layer formed on said buss bar.

* * * * *